United States Patent
Shin (10) Patent No.: US 8,243,867 B2
(45) Date of Patent: Aug. 14, 2012

(54) RECEIVER AND COMMUNICATION SYSTEM HAVING THE SAME

(75) Inventor: Jong-Shin Shin, Anyang-si (KR)

(73) Assignee: Samsung Electronics Co. Ltd., Gyeonggi-Do (KR)

( * ) Notice: Subject to any disclaimer, the term of this patent is extended or adjusted under 35 U.S.C. 154(b) by 689 days.

(21) Appl. No.: 12/314,211

(22) Filed: Dec. 5, 2008

(65) Prior Publication Data

US 2009/0147897 A1    Jun. 11, 2009

(30) Foreign Application Priority Data

Dec. 7, 2007  (KR) .................. 10-2007-0126789

(51) Int. Cl.
*H04L 7/00* (2006.01)
(52) U.S. Cl. ........ 375/355; 375/316; 375/354; 375/362; 375/370; 375/371; 375/373; 375/375
(58) Field of Classification Search .................. 375/355, 375/316, 354, 362, 370, 371, 373, 375
See application file for complete search history.

(56) References Cited

U.S. PATENT DOCUMENTS

| | | | |
|---|---|---|---|
| 6,701,133 B1 | 3/2004 | Bennett et al. | |
| 6,795,695 B1 | 9/2004 | Brekelmans et al. | |
| 6,920,190 B2 | 7/2005 | Simmons et al. | |
| 7,826,581 B1* | 11/2010 | Prather et al. | 375/373 |
| 7,916,820 B2* | 3/2011 | Cranford et al. | 375/357 |
| 2003/0223527 A1* | 12/2003 | Otomo | 375/376 |
| 2005/0259950 A1* | 11/2005 | Landsiedel et al. | 386/46 |
| 2006/0046663 A1* | 3/2006 | Yu | 455/76 |
| 2006/0139194 A1* | 6/2006 | Hasegawa | 341/143 |
| 2008/0075220 A1* | 3/2008 | Honken et al. | 375/376 |

FOREIGN PATENT DOCUMENTS

| | | |
|---|---|---|
| JP | 2001-086031 | 3/2001 |
| JP | 2001-088031 | 3/2001 |
| KR | 10-2005-0066820 | 6/2005 |

\* cited by examiner

*Primary Examiner* — Siu Lee
(74) *Attorney, Agent, or Firm* — Harness, Dickey & Pierce, PLC (57) ABSTRACT

A receiver may include a clock and data recovery circuit, a detection circuit and a sampling clock generator. The clock and data recovery circuit may receive first data and sample the first data to generate recovered data in response to a reception sampling clock signal. The detection circuit may detect a frequency difference between a transmission sampling clock signal and the reception sampling clock signal by comparing the first data and the reception sampling clock signal to generate a frequency difference detection signal. The sampling clock generator may generate the reception sampling clock signal based on the frequency difference detection signal and a first reference clock signal. Therefore, a communication system including the receiver may effectively reduce a jitter noise.

14 Claims, 6 Drawing Sheets

RECEIVER AND COMMUNICATION SYSTEM HAVING THE SAME

PRIORITY STATEMENT

This application claims priority under 35 U.S.C. §119 to Korean Patent Application No. 2007-0126789, filed on Dec. 7, 2007 in the Korean Intellectual Property Office (KIPO), the entire contents of which are incorporated herein by reference.

BACKGROUND

1. Technical Field

Example embodiments relate to a communication system, for example, to a receiver and a communication system having the same.

2. Description of the Related Art

Communication systems typically include a transmitter and a receiver. Data transmission methods of the communication systems are divided into a synchronous transmission method, a mesochronous transmission method, and a plesiochronous transmission method according to clock signals used for sampling data in the receiver.

In the communication system using the synchronous transmission method, a frequency and a phase of a clock signal used in a receiver are substantially the same as a frequency and a phase of a clock signal used in a transmitter. In the communication system using the mesochronous transmission method, the frequencies of the clock signals used in the receiver and the transmitter are identical to each other. However, the phases of the clock signals used in the receiver and the transmitter in the communication system using the mesochronous transmission method are different from each other. In the communication system using the plesiochronous transmission method, the frequency and the phase of the clock signal used in the receiver are different from the frequency and the phase of the clock signal used in the transmitter.

Therefore, the receiver in the communication system using the plesiochronous transmission method needs to have a clock and data recovery circuit (CDR) for recovering clock and data.

When the frequencies of clock signals used for the receiver and the transmitter are different from each other, an edge of the clock signal of the transmitter continually moves toward one direction on the basis of the clock signal of the transmitter, and then a sinusoidal jitter in the CDR may occur. The sinusoidal jitter may increase according to an increase of the transmission frequency.

The sinusoidal jitter caused by frequency difference between the clock signals of the receiver and the transmitter degrades performance of the CDR and increases a bit error rate (BER). Therefore, a means for adjusting the frequency of the clock signal is required such that the frequency of the clock signal of the receiver is substantially identical to the frequency of the clock signal of the transmitter.

SUMMARY

Example embodiments may provide a receiver for generating a clock signal of which a frequency is substantially identical to a frequency of a clock signal of a transmitter by detecting a frequency difference between the clock signals of the receiver and the transmitter.

Example embodiments may provide a communication system including the receiver.

According to example embodiments, a receiver may include a detection circuit and a sampling clock generator. A receiver may also include a clock and data recovery circuit (CDR), and an oscillator.

According to example embodiments, the CDR may receive first data and sample the first data to generate recovered data in response to a reception sampling clock signal. The oscillator may generate a first reference clock signal. The detection circuit may detect a frequency difference between a transmission sampling clock signal and the reception sampling clock signal by comparing the first data and the reception sampling clock signal to generate a frequency difference detection signal. The sampling clock generator may generate the reception sampling clock signal based on the frequency difference detection signal and the first reference clock signal.

In example embodiments, the sampling clock generator may include a frequency synthesizer that generates the reception sampling clock signal based on the frequency difference detection signal and the first reference clock signal.

In example embodiments, the frequency synthesizer may include a sigma-delta modulator and a phase-locked loop.

The sigma-delta modulator may generate a fractional signal based on the frequency difference detection signal. The phase-locked loop may phase-lock the first reference clock signal in response to the fractional signal to generate the reception sampling clock signal.

In example embodiments, the sampling clock generator may include a phase-locked loop and a post-processing frequency synthesizer.

The phase-locked loop may generate a first clock signal based on the first reference clock signal. The post-processing frequency synthesizer may generate the reception sampling clock signal based on the frequency difference detection signal and the first reference clock signal.

In some embodiments, the post-processing frequency synthesizer may include a sigma-delta modulator, a demultiplexer, a first multiplexer, a delay-locked loop, and a second multiplexer.

The sigma-delta modulator may generate a fractional signal in response to the frequency difference detection signal. The demultiplexer may demultiplex the first reference clock signal. The first multiplexer may multiplex an output signal of the demultiplexer in response to the fractional signal. The delay-locked loop may phase-lock an output signal of the multiplexer. The second multiplexer may selectively output one of the first reference clock signal and an output signal of the delay-locked loop to generate the reception sampling clock signal.

In example embodiments, a communication system may include a transmitter and a receiver.

The transmitter may serialize second data in response to a transmission sampling clock signal to generate first data.

In example, embodiments, the transmitter may include a second oscillator, a phase-locked loop, and a serializer. The second oscillator may generate a second reference clock signal. The phase-locked loop may generate a transmission sampling clock signal based on the second reference clock signal. The serializer may sample the second data in response to the transmission sampling clock signal and output the first data.

Consequently, according to the example embodiment, a communication system may include the feedback loop implemented with the detection circuit and the sampling clock generator in the receiver so that the receiver adaptively synchronizes the reception sampling clock signal with the transmission sampling clock signal. Accordingly, the communication system may reduce a jitter noise caused by a frequency difference between the reception sampling clock signal and the transmission sampling clock signal.

BRIEF DESCRIPTION OF THE DRAWINGS

The above and other features and advantages will become more apparent by describing in detail example embodiments thereof with reference to the attached drawings in which.

DESCRIPTION OF THE EMBODIMENTS

Example embodiments will now be described more fully with reference to the accompanying drawings.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures. The figures are intended to depict example embodiments and should not be interpreted to limit the intended scope of the claims. The accompanying figures are not to be considered as drawn to scale unless explicitly noted.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. In this specification, the term "and/or" picks out each individual item as well as all combinations of them.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Now, in order to more specifically describe example embodiments, example embodiments will be described in detail with reference to the attached drawings. However, example embodiments are not limited to the embodiments described herein, but may be embodied in various forms.

Figure 1:
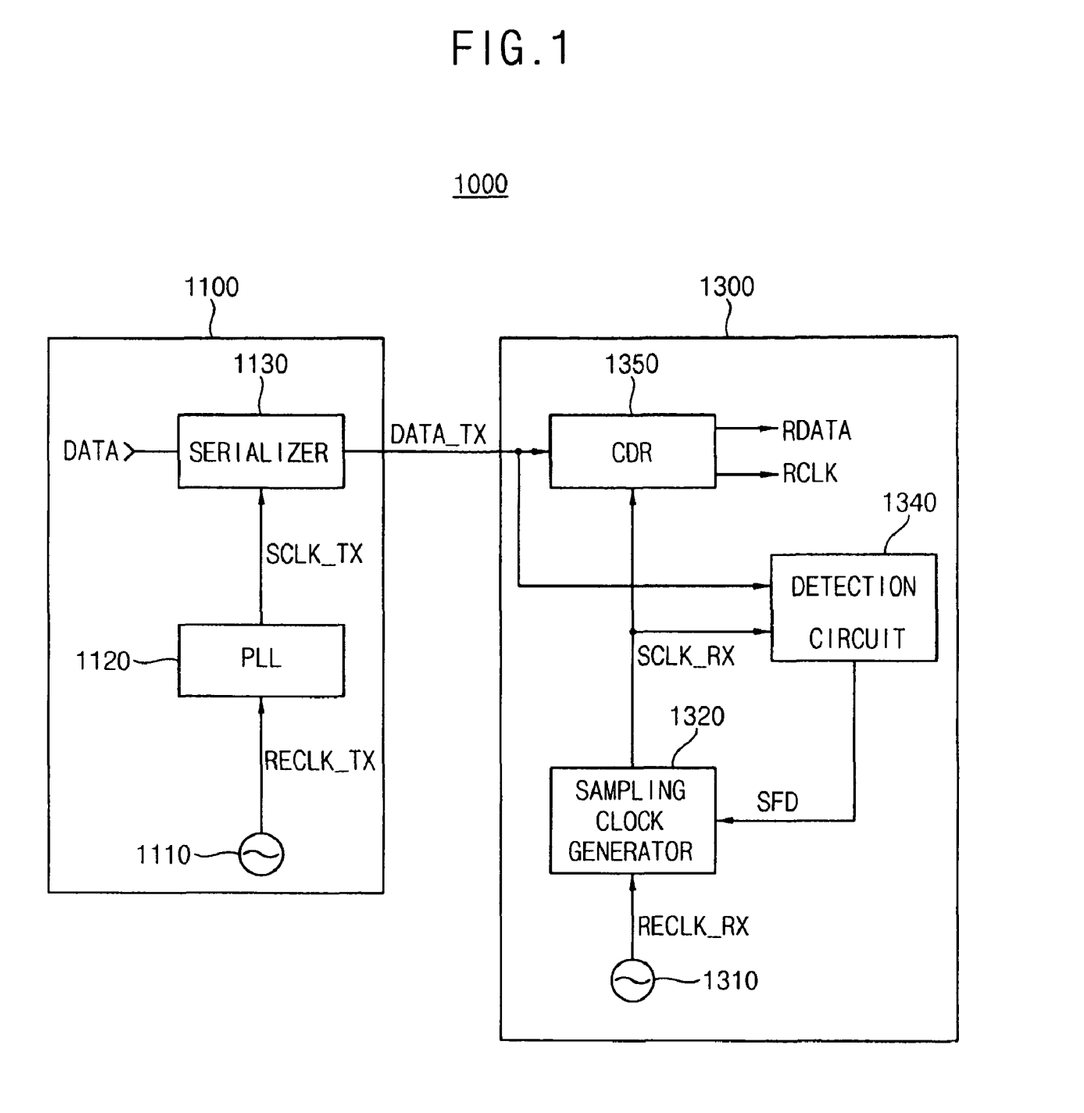
FIG. 1 is a block diagram illustrating a communication system according to example embodiments.

FIG. 1 is a block diagram illustrating a communication system according to example embodiments.

Referring to FIG. 1, a communication system 1000 includes a transmitter 1100 and a receiver 1300.

The transmitter 1100 may serialize second data DATA in response to a transmission sampling clock signal SCLK_TX to generate first data DATA_TX. The receiver 1300 may sample the first data DATA_TX to generate recovered data RDATA and a recovered clock signal RCLK.

The receiver 1300 includes a first oscillator 1310, a sampling clock generator 1320, a detection circuit 1340, and a clock and data recovery circuit (CDR) 1350.

The CDR 1350 may sample and align the first data DATA_TX to generate the recovered data RDATA. The first oscillator 1310 may generate a first reference clock signal RECLK_RX. The detection circuit 1340 may detect a frequency difference between the transmission sampling clock signal SCLK_TX and reception sampling clock signal SCLK_RX by comparing the first data DATA_TX and the reception sampling clock signal SCLK_RX to generate a frequency difference detection signal SFD. The sampling clock generator 1320 may generate the reception sampling clock signal SCLK_RX based on the frequency difference detection signal SFD and the first reference clock signal RECLK_RX.

The transmitter 1100 includes a second oscillator 1110, a phase-locked loop 1120, and a serializer 1130.

The second oscillator 1110 may generate a second reference clock signal RECLK_TX. The phase-locked loop 1120 may generate the transmission sampling clock signal SCLK_TX based on the second reference clock signal RECLK_TX. The serializer 1130 may sample the second data DATA based on the transmission sampling clock signal SCLK_TX and output the sampled second data DATA as the first data DATA_TX.

Figure 2:
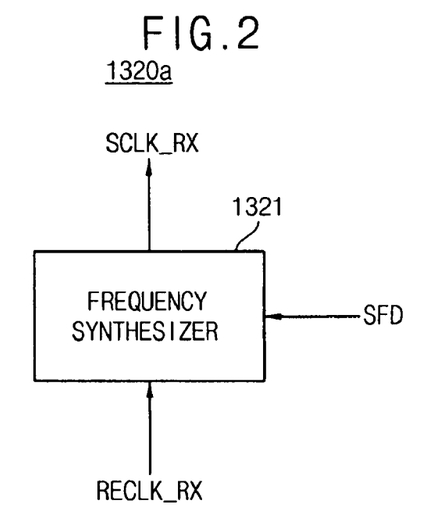
FIG. 2 is a block diagram illustrating an example of the sampling clock generator included in the receiver of the communication system of FIG. 1.

FIG. 2 is a block diagram illustrating an example of the sampling clock generator included in the receiver 1300 of the communication system of FIG. 1.

Referring to FIG. 2, a sampling clock generator 1320*a* may include a frequency synthesizer 1321 which generates the reception sampling clock signal SCLK_RX based on the frequency difference detection signal SFD and the first reference clock signal RECLK_RX.

Figure 3:
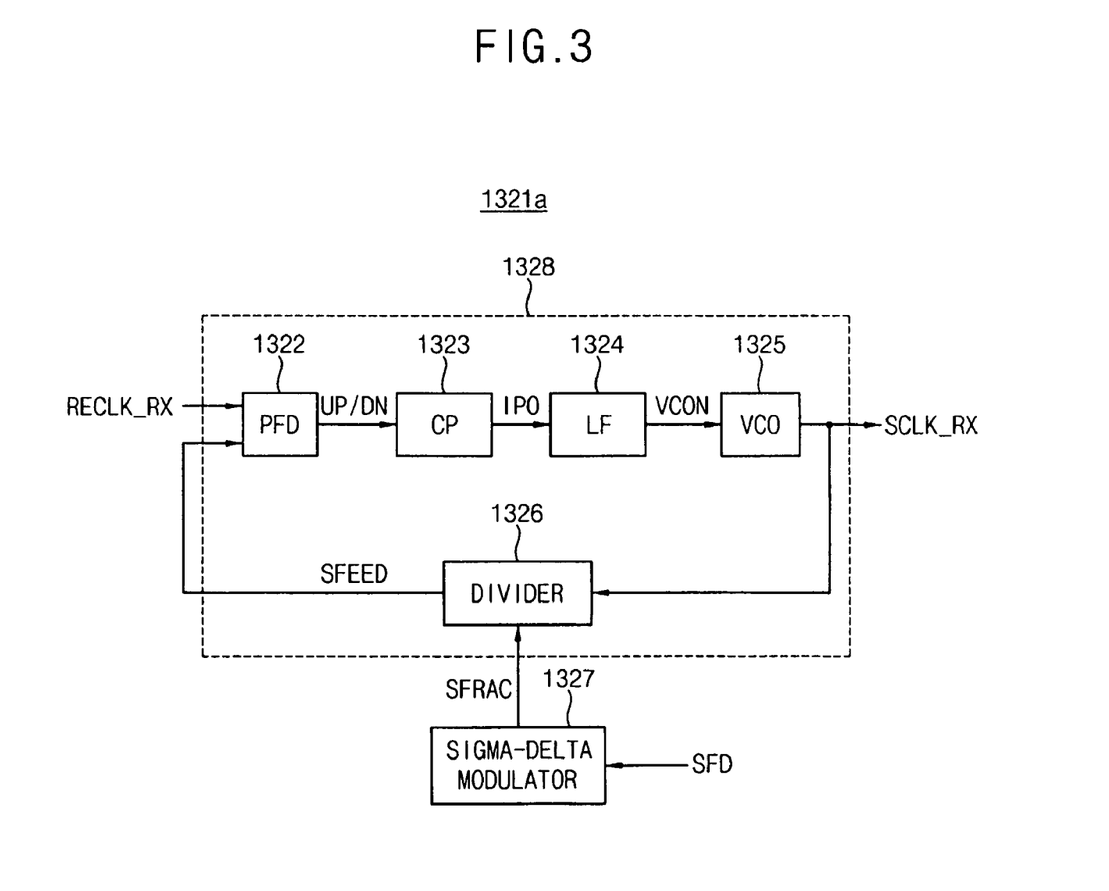
FIG. 3 is a block diagram illustrating an example of the frequency synthesizer illustrated in FIG. 2.

FIG. 3 is a block diagram illustrating an example of the frequency synthesizer 1321 illustrated in FIG. 2.

Referring to FIG. 3, a frequency synthesizer 1321*a* includes a sigma-delta modulator 1327 and a phase-locked loop 1328.

The sigma-delta modulator 1327 may generate a fractional signal SFRAC in response to the frequency difference detection signal SFD. The phase-locked loop 1328 may phase-lock the first reference clock signal RECLK_RX to generate the reception sampling clock signal SCLK_RX.

The phase-locked loop 1328 includes a phase-frequency detector 1322, a charge pump 1323, a loop filter 1324, a voltage-controlled oscillator 1325, and a divider 1326.

The phase-frequency detector 1322 may generate an up signal UP or a down signal DOWN corresponding to a phase difference between the first reference clock signal RECLK_RX and a feedback signal SFEED. The charge pump 1323 may generate a pump output current IPO in response to the up signal UP or the down signal DOWN. The loop filter 1324 may integrate the pump output current IPO to generate an oscillation control voltage VCON. The voltage-controlled oscillator 1325 may generate the reception sampling clock signal SCLK_RX oscillating at a predetermined frequency in response to the oscillation control voltage VCON. The divider 1326 may divide the reception sampling clock signal SCLK_RX to generate the feedback signal SFEED in response to the fractional signal SFRAC.

Figure 4:
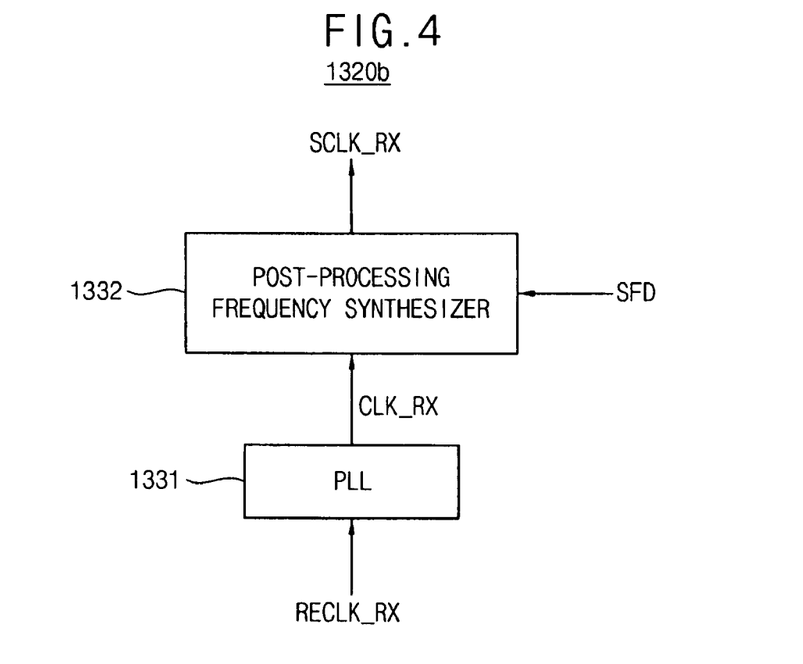
FIG. 4 is a block diagram illustrating another example of the sampling clock generator included in the receiver of the communication system of FIG. 1.

FIG. 4 is a block diagram illustrating another example of the sampling clock generator included in the receiver of the communication system of FIG. 1.

Referring to FIG. 4, a sampling clock generator 1320*b* includes a phase-locked loop 1331 and a post-processing frequency synthesizer 1332.

The phase-locked loop 1331 may generate a first clock signal CLK_RX based on the first reference clock signal RECLK_RX. The post-processing frequency synthesizer 1332 may generate the reception sampling clock signal SCLK_RX based on the frequency difference detection signal SFD and the first clock signal CLK_RX.

Figure 5:
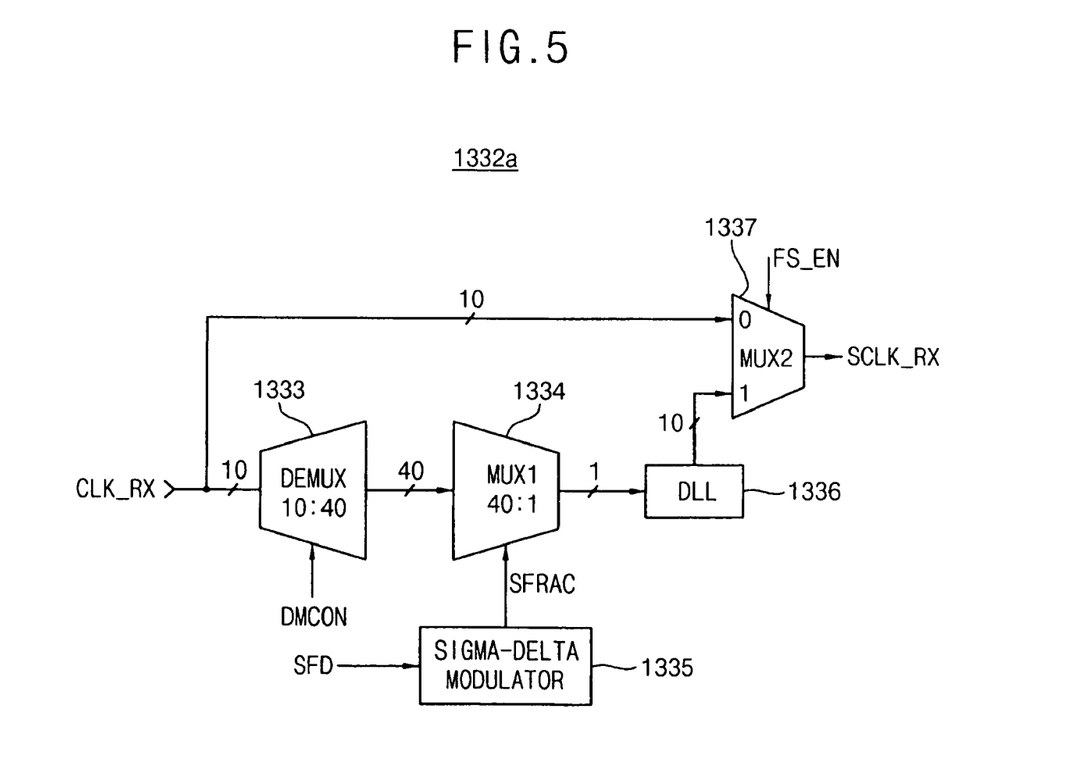
FIG. 5 is a circuit diagram illustrating an example of the post-processing frequency synthesizer included in the sampling clock generator of FIG. 4.

FIG. 5 is a circuit diagram illustrating an example of the post-processing frequency synthesizer 1332 included in the sampling clock generator of FIG. 4.

Referring to FIG. 5, a post-processing frequency synthesizer 1332*a* includes a demultiplexer 1333, a first multiplexer 1334, a sigma-delta modulator 1335, a delay-locked loop 1336, and a second multiplexer 1337.

The sigma-delta modulator 1335 may generate a fractional signal SFRAC in response to the frequency difference detection signal SFD. The demultiplexer 1333 may demultiplex the first clock signal CLK_RX based on a demultiplex control signal DMCON. The first multiplexer 1334 may multiplex an output signal of the demultiplexer 1333 in response to the fractional signal SFRAC. The delay-locked loop 1336 may generate a multi-phase clock signal in response to an output signal of the multiplexer 1334. The number of phases of the multi-phase clock signal may be the same as the number of phases of the first clock signal CLK_RX. For example, the number of phases of the first clock signal CLK_RX may be ten. The second multiplexer 1337 may selectively output the first clock signal CLK_RX or an output signal of the delay-locked loop 1336 to generate the reception sampling clock signal SCLK_RX based on a frequency synthesis enable signal FS_EN that indicates whether the post-processing frequency synthesizer 1332 performs a function. For example, when the post-processing frequency synthesizer 1332 does not perform a frequency synthesis function, the second multiplexer 1337 may select the first clock signal CLK_RX as the reception sampling clock signal SCLK_RX according to the frequency synthesis enable signal FS_EN. When the post-processing frequency synthesizer 1332 performs a frequency synthesis function, the second multiplexer 1337 may select the output signal of the delay-locked loop 1336 as the reception sampling clock signal SCLK_RX according to the frequency synthesis enable signal FS_EN.

In FIG. 5, the first clock signal CLK_RX may correspond to a ten-bit signal. The demultiplexer 1333 may demultiplex the ten-bit signal into a forty-bit signal. The multiplexer 1334 may multiplex the forty-bit signal into a one-bit signal. Therefore, the post-processing frequency synthesizer 1332 may synthesize the first clock signal CLK_RX with a frequency-synthesis ratio of one-fortieth (1/40).

A post-processing frequency synthesizer according to example embodiments may include a sigma-delta modulator and a phase synthesizer. The sigma-delta modulator may generate a fractional signal in response to the frequency difference detection signal SFD. The phase synthesizer may synthesize the first clock signal CLK_RX. Accordingly, the post-processing frequency synthesizer according to an example may control a phase synthesis ratio of the phase synthesizer by using the sigma-delta modulator.

A post-processing frequency synthesizer according to example embodiments may include a phase synthesizer controller and a phase synthesizer. The phase synthesizer controller may operate in response to a frequency difference detection signal SFD. The phase synthesizer may synthesize the first clock signal CLK_RX. Accordingly, the post-processing frequency synthesizer may control the phase synthesis ratio of the phase synthesizer by using the phase synthesizer controller.

While the first clock signal CLK_RX is shown as an input to the post-processing frequency synthesizers 1332 and 1332*a* in FIGS. 4 and 5, it will appreciated that other clock signals, such the as first reference clock signal RECLK_RX, may also be used.

Figure 6:
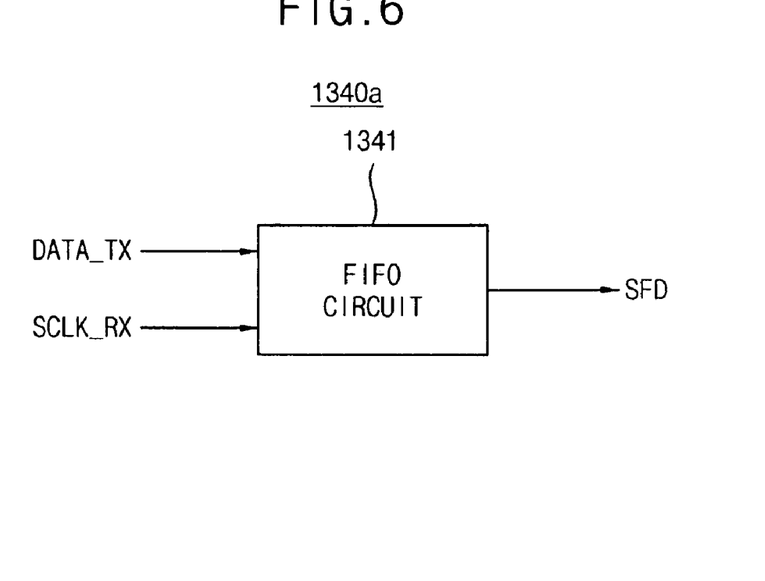
FIG. 6 is a block diagram illustrating an example of the detection circuit included in the receiver of the communication system of FIG. 1.

FIG. 6 is a block diagram illustrating an example of the detection circuit included in the receiver 1300 of the communication system of FIG. 1.

Referring to FIG. 6, a detection circuit 1340*a* includes a first-in first-out (FIFO) circuit 1341. The FIFO circuit 1341 may compare the first data DATA_TX and the reception sampling clock signal SCLK_RX and detect a frequency difference between the transmission sampling clock signal SCLK_TX and the reception sampling clock signal SLCK_RX to generate the frequency difference detection signal SFD.

In a blind oversampling CDR, an over-run block and/or an under-run block or function may be used in the FIFO circuit 1341 to detect the frequency difference between the transmission sampling clock signal SCLK_TX and the reception sampling clock signal SLCK_RX.

Figure 7:
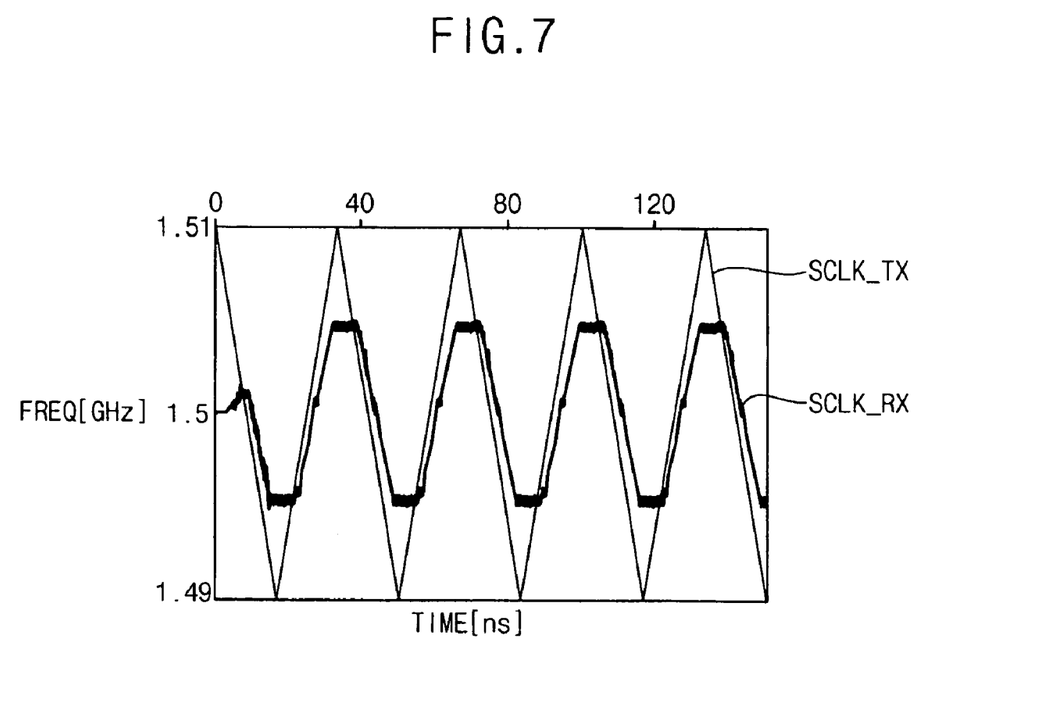
FIG. 7 is a diagram illustrating waveforms of a reception sampling clock signal and a transmission sampling clock signal in a communication system according to example embodiments.

FIG. 7 is a diagram illustrating waveforms of a reception sampling clock signal and a transmission sampling clock signal in a communication system where a frequency synthesis function is performed by using post-processing according to an example embodiment.

Figure 8:
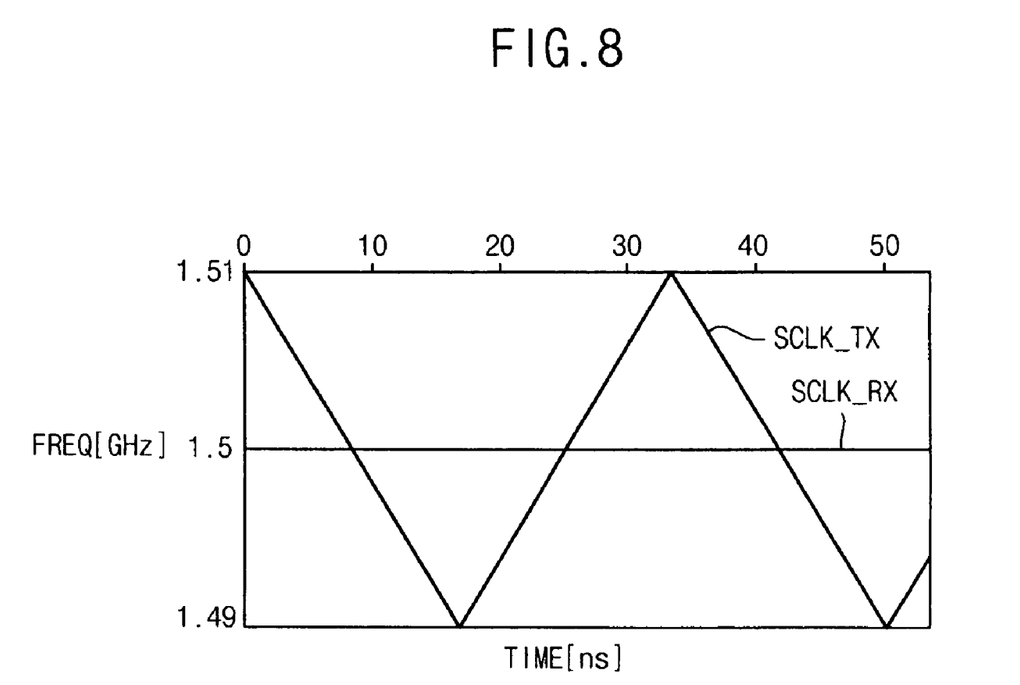
FIG. 8 is a diagram illustrating waveforms of a reception sampling clock signal and a transmission sampling clock signal in a conventional communication system.

FIG. 8 is a diagram illustrating waveforms of a reception sampling clock signal and a transmission sampling clock signal in a conventional communication system.

In FIGS. 7 and 8, SLCK_TX represents a transmission sampling clock signal and SLCK_RX represents a reception sampling clock signal.

Hereinafter, an operation of the communication system according to an example embodiment will be described with reference to FIGS. 1 to 8.

In the communication system 1000 of FIG. 1, the receiver 1300 may include a feedback loop implemented with the sampling clock generator 1320 and the detection circuit 1340. The receiver 1300 in the communication system 1000 may adaptively synchronize the frequency of the reception sampling clock signal SCLK_RX with the frequency of the transmission sampling clock signal SCLK_TX. Accordingly, a jitter noise caused by a frequency difference between the reception sampling clock signal SCLK_RX and the transmission sampling clock signal SCLK_TX may be reduced.

Referring to FIG. 1, the detection circuit 1340 may compare the first data DATA_TX and the reception sampling clock signal SCLK_RX to detect the frequency difference between the transmission sampling clock signal SCLK_TX and the reception clock signal SCLK_RX to generate the frequency difference detection signal SFD. The sampling clock generator 1320 may generate the reception sampling clock signal SCLK_RX based on the frequency difference detection signal SFD and the first reference clock signal RECLK_RX.

For example, the detection circuit 1340 may output the frequency difference detection signal SFD having a value of "1" when the frequency of the reception sampling clock signal SCLK_RX is higher than the frequency of the transmission sampling clock signal SCLK_TX. When the frequency of the reception sampling clock signal SCLK_RX is lower than the frequency of the transmission sampling clock signal SCLK_TX, the detection circuit 1340 may output the frequency difference detection signal SFD having a value of "−1". When the frequency of the reception sampling clock signal SCLK_RX is substantially identical to the frequency of the transmission sampling clock signal SCLK_TX, the detection circuit 1340 may output the frequency difference detection signal SFD having a value of "0".

The sampling clock generator 1320 may output the reception sampling clock signal SCLK_RX of which the frequency is substantially identical to the transmission sampling clock signal SCLK_TX when the frequency difference detection signal SFD has a value of "0" applied thereto. The sampling clock generator 1320 may decrease the frequency of the first reference clock signal RECLK_RX and output the first reference clock signal RECLK_RX having the decreased frequency as the reception sampling clock signal SCLK_RX when the frequency difference detection signal SFD has a value of "1" applied thereto. The sampling clock generator 1320 may increase the frequency of the first reference clock signal RECLK_RX and output the first reference clock signal RECLK_RX having the increased frequency as the reception sampling clock signal SCLK_RX when the frequency difference detection signal SFD has a value of "−1" applied thereto.

The feedback loop implemented with the detection circuit 1340 and the sampling clock generator 1320 may repeatedly compare the first data DATA_TX and the reception sampling clock signal SCLK_RX so that the reception sampling clock signal SCLK_RX may obtain a frequency is substantially identical to that of the transmission sampling clock signal SCLK_TX.

In example embodiments, the frequency difference detection signal SFD may have various values. For example, the frequency difference detection signal SFD may have values of "3", "2", "1", "0", "−1", "−2" and "−3". The detection circuit 1340 may generate the frequency difference detection signal SFD having different values based on the frequency difference between the first data DATA_TX and the reception sampling clock signal SCLK_RX.

The sampling clock generator 1320 may be implemented with the frequency synthesizer 1321 as illustrated in FIG. 2. The sampling clock generator 1320 may also be implemented with the phase-locked loop 1331 and the post-processing frequency synthesizer 1332 as illustrated in FIG. 4.

When the frequency of the reception sampling clock signal SCLK_RX used for the receiver is lower than the frequency of the transmission sampling clock signal SCLK_TX used for the transmitter, the FIFO circuit included in the blind oversampling CDR may repeatedly generate an over-run signal (not shown). The frequency difference detection signal SFD of the frequency synthesizer may be obtained by filtering the over-run signal.

The CDR using the phase synthesizer such as a phase interpolator may activate the frequency difference detection signal SFD when a phase of an output signal of the phase synthesizer exceeds one unit interval (UI) toward one direction.

In the communication system, a spread spectrum clock (SSC) generator may be used as the frequency synthesizer 1321 in FIG. 2. When the SSC generator is used as the frequency synthesizer, the reception sampling clock signal SCLK_RX adapted to have a frequency that is substantially identical to the transmission sampling clock signal SCLK_TX may be obtained without additional circuits.

The communication system according to example embodiments may adaptively adjust the frequency of the reception sampling clock signal SCLK_RX, thereby decreasing a maximum value of the frequency difference between the reception sampling clock signal SCLK_RX and the transmission sampling clock signal SCLK_TX as illustrated in FIG. 7.

In the conventional communication system, the maximum value of the frequency difference between the reception sampling clock signal SCLK_RX and the transmission sampling clock signal SCLK_TX is high due to frequency locking of the reception sampling clock signal SCLK_RX, as illustrated in FIG. 8.

Figure 9:
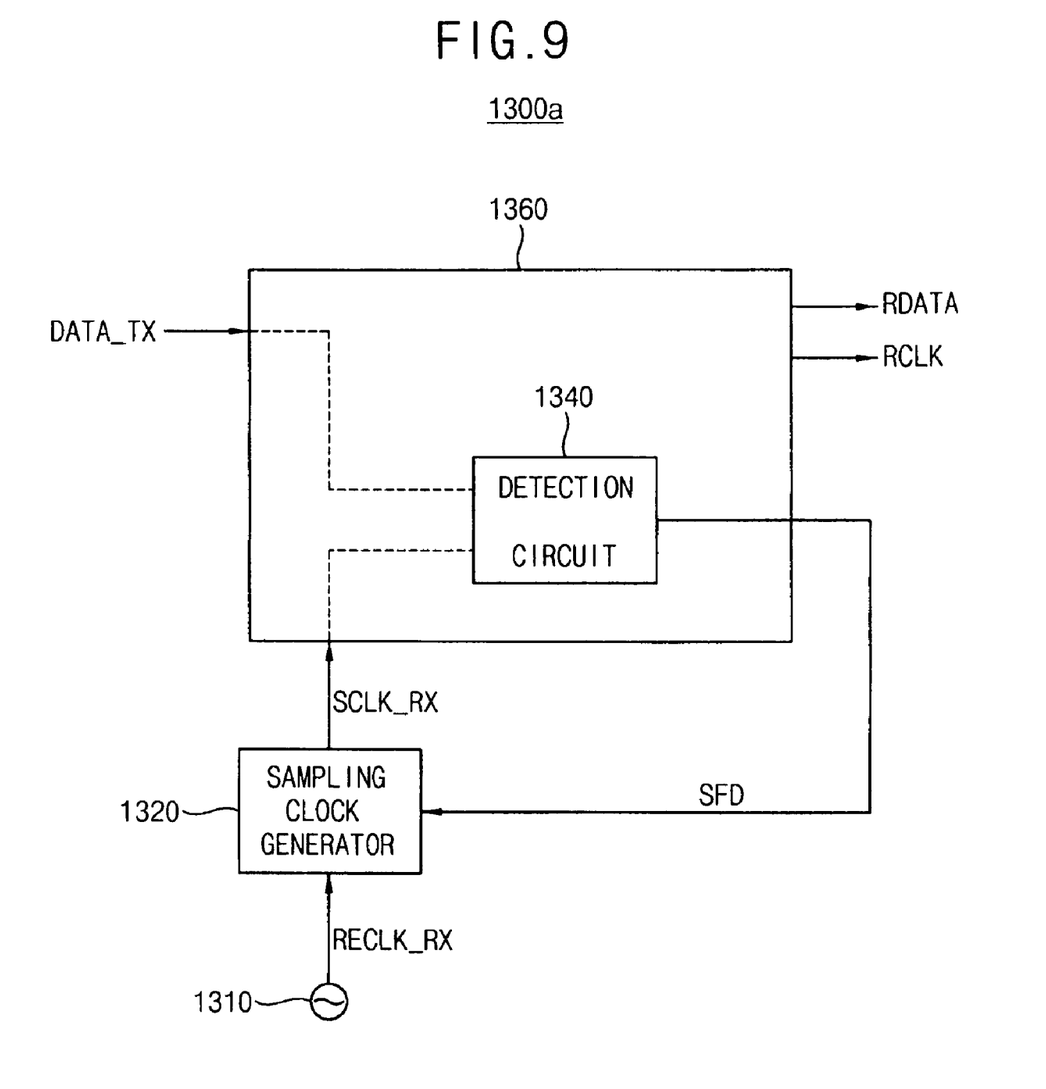
FIG. 9 is a block diagram illustrating another example of the receiver included in the communication system of FIG. 1.

FIG. 9 is a block diagram illustrating another example of the receiver included in the communication system of FIG. 1.

Referring to FIG. 9, a receiver 1300a includes a first oscillator 1310, a sampling clock generator 1320, and a CDR 1360.

The CDR 1360 may generate recovered clock signal RCLK based on first data DATA_TX. The CDR 1360 may sample and align the first data DATA_TX in response to the reception sampling clock signal SCLK_RX to generate recovered data RDATA. The sampling clock generator 1320 may generate the reception sampling clock signal SCLK_RX based on the frequency difference detection signal SFD and a first reference clock signal RECLK_RX.

The CDR 1360 may include a detection circuit 1340 which compares the first data DATA_TX and the reception sampling clock signal SLCK_RX. The detection circuit 1340 may detect a frequency difference between a transmission sampling clock signal SCLK_TX and the reception sampling clock signal SCLK_RX to generate a frequency difference detection signal SFD.

An operation of the receiver 1300a of FIG. 9 may be similar to the operation of the receiver 1300 of FIG. 1. Therefore, a detailed description of the operation of the receiver 1300a will be omitted.

The receiver according to example embodiments may be adapted to the communication system, for example, to the communication system which includes the transmitter and receiver having semiconductor integrated circuits.

While the example embodiments and their advantages have been described in detail, it should be understood that various changes, substitutions and alterations may be made herein without departing from the scope of example embodiments.

What is claimed is:

1. A receiver, comprising:
   a clock and data recovery (CDR) circuit configured to receive first data and sample the first data to generate recovered data in response to a reception sampling clock signal;
   a detection circuit configured to detect a frequency difference between a transmission sampling clock signal and the reception sampling clock signal by comparing the first data and the reception sampling clock signal to generate a frequency difference detection signal; and
   a sampling clock generator configured to generate the reception sampling clock signal based on the frequency difference detection signal and a first reference clock signal, and
   wherein the sampling clock generator includes a phase-locked loop configured to phase-lock the first reference clock signal based on the frequency difference detection signal to generate the reception sampling clock signal.

2. The receiver of claim 1, further comprising:
   an oscillator configured to generate the first reference clock signal.

3. The receiver of claim 1, wherein the sampling clock generator includes a frequency synthesizer configured to generate the reception sampling clock signal based on the frequency difference detection signal and the first reference clock signal.

4. A communication system, comprising:
   the receiver of claim 1; and
   a transmitter configured to serialize second data in response to a transmission sampling clock signal to generate the first data.

5. The communication system of claim 4, wherein,
   the receiver further includes,
      a first oscillator configured to generate the first reference clock signal, and wherein the transmitter includes,
      a second oscillator configured to generate a second reference clock signal,
      a phase-locked loop configured to generate a transmission sampling clock signal based on the second reference clock signal, and
      a serializer configured to sample the second data in response to the transmission sampling clock signal and to output the first data.

6. The communication system of claim 4, wherein the sampling clock generator includes a frequency synthesizer configured to generate the reception sampling clock signal based on the frequency difference detection signal and the first reference clock signal.

7. A receiver, comprising:
   a clock and data recovery (CDR) circuit configured to receive first data and sample the first data to generate recovered data in response to a reception sampling clock signal;
   a detection circuit configured to detect a frequency difference between a transmission sampling clock signal and the reception sampling clock signal by comparing the first data and the reception sampling clock signal to generate a frequency difference detection signal; and
   a sampling clock generator configured to generate the reception sampling clock signal based on the frequency difference detection signal and a first reference clock signal,
   wherein the sampling clock generator includes a frequency synthesizer configured to generate the reception sampling clock signal based on the frequency difference detection signal and the first reference clock signal, and
   wherein the frequency synthesizer includes,
      a sigma-delta modulator configured to generate a fractional signal based on the frequency difference detection signal; and
      a phase-locked loop configured to phase-lock the first reference clock signal in response to the fractional signal to generate the reception sampling clock signal.

8. The receiver of claim 7, wherein the frequency synthesizer is a spread spectrum clock generator.

9. The receiver of claim 7, wherein the phase-locked loop includes,
   a phase-frequency detector configured to generate one of an up signal and a down signal corresponding to a phase difference between the first reference clock signal and a feedback signal,
   a charge pump configured to generate a pump output current in response to the one of the up signal or the down signal,
   a loop filter configured to integrate the pump output current to generate an oscillation control voltage,
   a voltage-controlled oscillator configured to generate the reception sampling clock signal having a first frequency in response to the oscillation control voltage, and
   a divider configured to divide the reception sampling clock signal to generate the feedback signal in response to the fractional signal.

10. A communication system, comprising:
    the receiver of claim 7; and
    a transmitter configured to serialize second data in response to a transmission sampling clock signal to generate the first data.

11. The communication system of claim 10, wherein the frequency synthesizer is a spread spectrum clock generator.

12. A receiver, comprising:
a clock and data recovery (CDR) circuit configured to receive first data and sample the first data to generate recovered data in response to a reception sampling clock signal;
a detection circuit configured to detect a frequency difference between a transmission sampling clock signal and the reception sampling clock signal by comparing the first data and the reception sampling clock signal to generate a frequency difference detection signal; and
a sampling clock generator configured to generate the reception sampling clock signal based on the frequency difference detection signal and a first reference clock signal,
wherein the detection circuit is a first-in first-out (FIFO) circuit, and
wherein the FIFO circuit is configured to detect a frequency difference between the transmission sampling clock signal and the reception sampling clock signal by performing at least one of an over-run function and an under-run function.

13. The receiver of claim 1, wherein the CDR circuit is configured to generate a recovered clock signal and the recovered data.

14. A communication system, comprising:
the receiver of claim 12; and
a transmitter configured to serialize second data in response to a transmission sampling clock signal to generate the first data.

* * * * *